(12) United States Patent
Bai et al.

(10) Patent No.: US 9,190,351 B2
(45) Date of Patent: Nov. 17, 2015

(54) SEMICONDUCTOR DEVICE WITH WEBBING BETWEEN LEADS

(71) Applicant: Freescale Semiconductor, Inc., Austin, TX (US)

(72) Inventors: Zhigang Bai, Tianjin (CN); Hui Wang, Tianjin (CN); Jinzhong Yao, Tianjin (CN)

(73) Assignee: FREESCALE SEMICONDUCTOR, INC. AUSTIN, Austin, TX (US)

( * ) Notice: Subject to any disclaimer, the term of this patent is extended or adjusted under 35 U.S.C. 154(b) by 0 days.

(21) Appl. No.: 14/517,934

(22) Filed: Oct. 20, 2014

(65) Prior Publication Data
US 2015/0206831 A1    Jul. 23, 2015

(30) Foreign Application Priority Data

Jan. 17, 2014  (CN) .......................... 2014 1 0022758

(51) Int. Cl.
*H01L 21/48* (2006.01)
*H01L 23/495* (2006.01)
*H01L 21/56* (2006.01)

(52) U.S. Cl.
CPC ...... *H01L 23/49555* (2013.01); *H01L 21/4842* (2013.01); *H01L 21/565* (2013.01); *H01L 2924/0002* (2013.01)

(58) Field of Classification Search
CPC ............ H01L 2224/48247; H01L 21/565; H01L 2924/0665; H01L 23/49551; H01L 23/49575
See application file for complete search history.

(56) References Cited

U.S. PATENT DOCUMENTS

| | | | |
|---|---|---|---|
| 4,942,455 A * | 7/1990 | Shinohara | 257/666 |
| 5,157,480 A | 10/1992 | McShane | |
| 5,271,148 A * | 12/1993 | Desrochers et al. | 29/827 |
| 5,410,804 A * | 5/1995 | Berendts | 29/827 |
| 5,640,746 A * | 6/1997 | Knecht et al. | 29/25.35 |
| 5,665,296 A | 9/1997 | Jain | |
| 5,939,775 A * | 8/1999 | Bucci et al. | 257/667 |
| 6,627,976 B1 * | 9/2003 | Chung et al. | 257/666 |
| 6,797,542 B2 | 9/2004 | Kuratomi | |
| 6,818,973 B1 | 11/2004 | Foster | |
| 7,002,240 B2 * | 2/2006 | Madrid | 257/676 |
| 7,687,892 B2 | 3/2010 | Espiritu | |
| 7,989,933 B1 | 8/2011 | Kim | |
| 8,304,866 B1 | 11/2012 | Choi | |
| 8,901,721 B1 * | 12/2014 | Bai et al. | 257/666 |

FOREIGN PATENT DOCUMENTS

EP    0401017    8/1997

* cited by examiner

*Primary Examiner* — Roy Potter
(74) *Attorney, Agent, or Firm* — Charles Bergere

(57) ABSTRACT

A quad flat package integrated circuit (IC) device has alternating inner and outer leads that protrude from a package body. The inner leads are j-shaped leads and the outer leads are gull-wing shaped leads. The package body is formed such that it includes plastic lead webbings between adjacent leads, which help prevent metal particles from getting lodged between the leads and causing electrical shorts. The webbings are made of the same molding compound as the package body and are formed together with the package body.

18 Claims, 4 Drawing Sheets

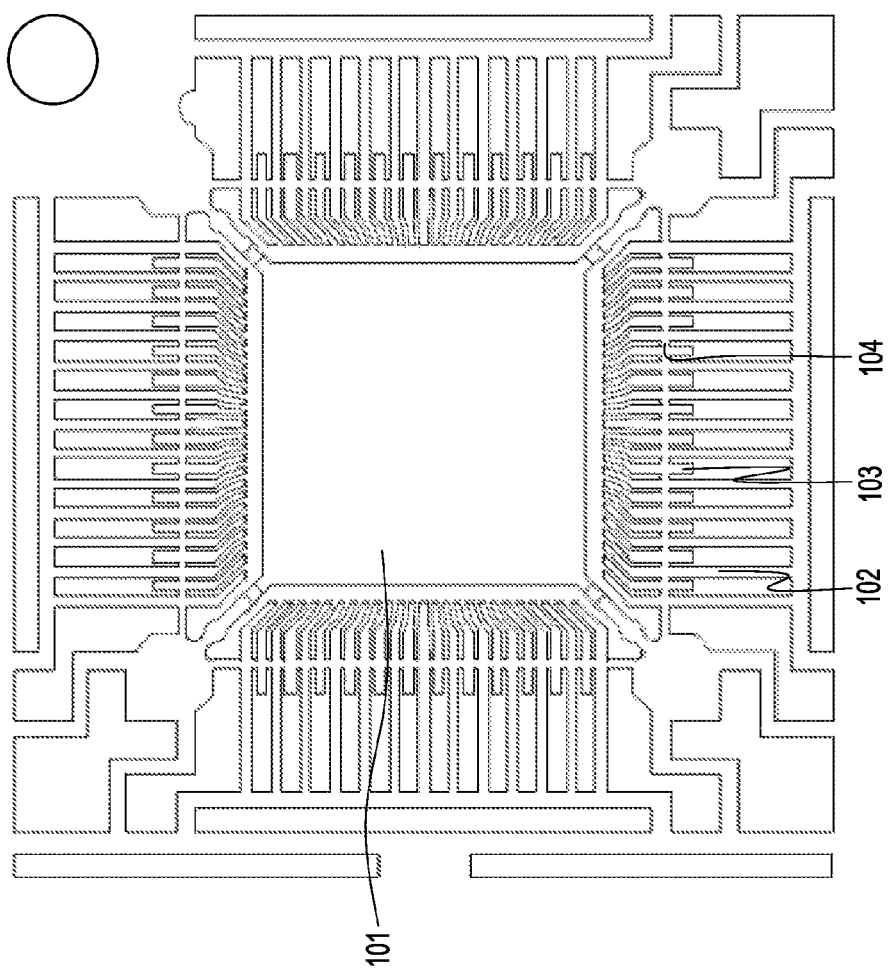

SECTION ZZ-ZZ

SECTION YY-YY

SEMICONDUCTOR DEVICE WITH WEBBING BETWEEN LEADS

BACKGROUND OF THE INVENTION

The present invention relates to integrated circuit (IC) packaging, and more particularly to the case outline and corresponding mold cavity for a semiconductor device.

In order to assemble a typical packaged integrated circuit (IC) device, an IC die is adhesively mounted on and electrically connected to a lead frame. The lead frame is a patterned sheet metal cutout that includes (1) a die pad, also called a flag, for mounting the IC die, and (2) lead fingers, or leads, for providing electrical connections between device-internal components on the die and device-external components. Device-external components might include power sources and input/output connections on a printed circuit board (PCB) on which the IC device is mounted. Wire bonding is performed after the die is mounted on the lead frame. In wire bonding, metal bond wires are bonded to bond pads on the die and corresponding leads on the lead frame.

Following wire bonding, the assembly, including the die, lead frame, and bond wires, is encapsulated with a molding compound, leaving the distal ends of the leads exposed, and then the molding compound is cured. After encapsulation, usually as part of singulation, the process of separating a plurality of attached IC devices into single chips, the IC device is trimmed and formed to make the packaged IC device that is ready for mounting on a circuit board. The trimming includes cutting and/or removing lead frame support structures that were used to hold the leads in place. The forming typically includes bending the leads into shapes, such as so-called gull wings, to allow for attachments to PCBs.

The above-described encapsulation step includes putting the assembly inside a mold form having a cavity, injecting uncured molding compound into the cavity, curing the molding compound, and then removing the mold form. The cured encapsulant, or molding compound, portion of the IC device is referred to herein as the package body or case. The case outline refers to the outline of the case in a plan view. The conventional case outline is a plain rectangle.

Some IC devices have a relatively small size and a relatively high number of leads, which leads to a relatively narrow lead pitch, or distance between adjacent leads (lead pitch is measured as the distance between the center lines of two adjacent leads). The width of the space between two adjacent leads, referred to herein as the lead gap, is equivalent to the lead pitch minus the width of a lead. Generally, the narrower the lead pitch the greater the risk that an electrical short between adjacent leads might occur since the lead-gap width is narrower if the lead width stays the same. Note that sometimes the actual lead-gap width may be narrower than the nominal lead-gap width because of a post-encapsulation plating step in which the exposed portions of the leads are plated with a material to prevent oxidation. Electrical shorts may occur, for example, during the trimming and forming stage, if stray bits of metal get trapped between two adjacent leads.

BRIEF DESCRIPTION OF THE DRAWINGS

Other aspects, features, and advantages of the invention will become more fully apparent from the following detailed description, the appended claims, and the accompanying drawings in which like reference numerals identify similar or identical elements.

FIG. 1 shows a plan view of a lead frame in accordance with one embodiment of the invention;

DETAILED DESCRIPTION

Figure 3:
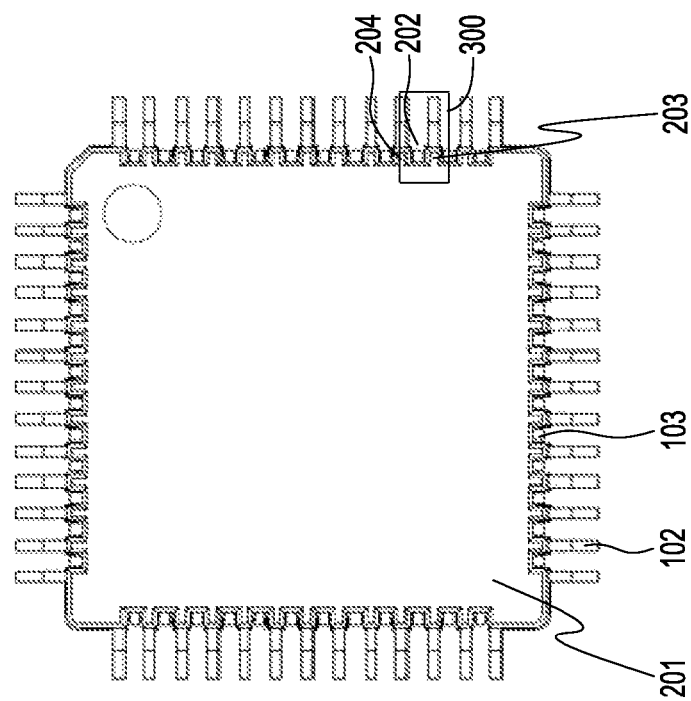
FIG. 3 shows a plan view of the IC device of FIG. 2 after trimming and forming.

Detailed illustrative embodiments of the present invention are disclosed herein. However, specific structural and functional details disclosed herein are merely representative for purposes of describing example embodiments of the present invention. Embodiments of the present invention may be embodied in many alternative forms and should not be construed as limited to only the embodiments set forth herein. Further, the terminology used herein is for the purpose of describing particular embodiments only and is not intended to be limiting of example embodiments of the invention.

As used herein, the singular forms "a," "an," and "the," are intended to include the plural forms as well, unless the context clearly indicates otherwise. It further will be understood that the terms "comprises," "comprising," "has," "having," "includes," and/or "including" specify the presence of stated features, steps, or components, but do not preclude the presence or addition of one or more other features, steps, or components. It also should be noted that, in some alternative implementations, the functions/acts noted may occur out of the order noted in the figures.

In one embodiment, an IC device is in the form of a QFP (quad flat package) having at least two rows of leads that is a combination of a conventional quad flat package (QFP) and a conventional plastic leaded chip carrier (PLCC) package. A QFP package is rectangular in plan view and has gull-wing leads on all four sides. A PLCC package is rectangular in plan view and has j-shaped, i.e., curled in leads on all four sides. The dual row QFP package of the present invention is rectangular in plan view and has alternating gull-wing and j-shaped leads on all four sides. Note that, in one embodiment, the rows of leads are staggered with respect to each other such that the j-shaped leads emerge from the case at a first horizontal level and the gull-wing leads emerge from the case at a second horizontal level different from the first level. In another embodiment, the j-shaped leads emerge from the case at the same horizontal level as the gull-wing leads.

Referring now to FIG. 1, a plan view of a lead frame 100 for use in a dual row, straight QFP package in accordance with one embodiment of the invention is shown. The lead frame 100 comprises die pad 101, exemplary outer lead 102, exemplary inner lead 103, and exemplary dam bar 104. The outer lead 102 (and the other outer leads) will become, after singulation, trimming, and forming, the gull wing leads of the below-described, finished, straight dual row QFP IC device that includes the lead frame 100. The inner lead 103 (and the other inner leads of lead frame 100) will become, after singulation, trimming, and forming, the j-shaped leads IC device. The dam bar 104, like the other dam bars of the lead frame 100, runs perpendicular to the leads and is used to provide structural support to the leads prior to encapsulation.

The dam bar 104 may also be used during encapsulation in conjunction with the molding cavity to restrict the flow of the uncured encapsulant and define the case outline. During trimming, as described below, the dam bar 104 will be cut and/or trimmed so that adjacent leads are no longer physically or electrically connected. This allows the individual leads to be freely manipulated and be electrically independent.

Figure 2:
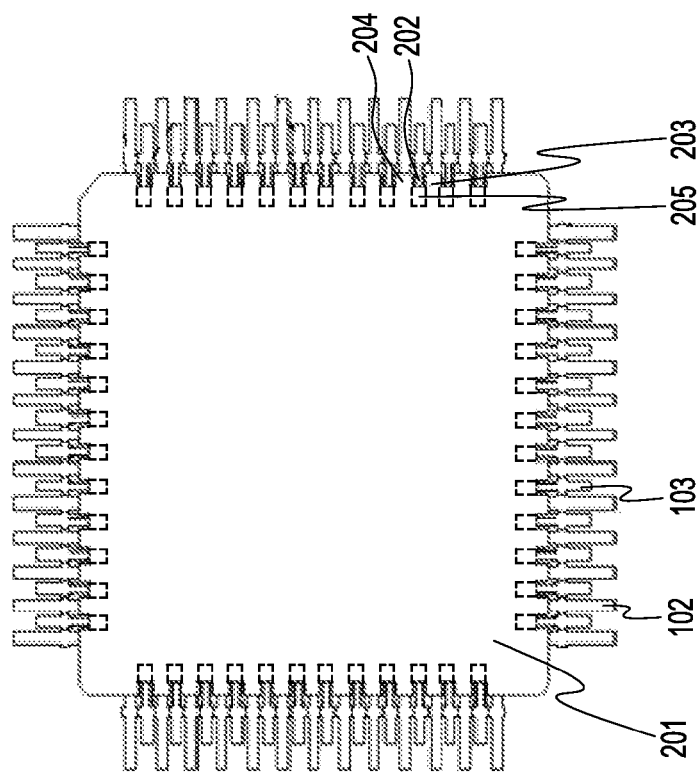
FIG. 2 shows a plan view of an encapsulated and partially trimmed IC device that includes the lead frame of FIG. 1.

FIG. 2 shows a plan view of an encapsulated and partially trimmed IC device 200, which includes the lead frame 100 of FIG. 1. The die pad 101 is not visible in FIG. 2 because it is encapsulated within a case 201. As can be seen, the outer portions of the lead frame 100 have been cut off so that the leads, including outer lead 102 and inner lead 103, may be trimmed and/or formed. Also, the dam bars, including dam bar 104, have been cut between adjacent leads so, as noted above, the leads are no longer conductively connected and each lead may be formed independently of its neighbors. Note that any remainders of the cut-up dam bars, which are typically in the form of lateral protrusions or burrs on the sides of the leads, are typically trimmed off in most types of packages. The burr removal reduces the risk of electrical shorts between adjacent leads. This risk is significant in packages where all of the leads are formed in substantially the same way, for example, all gull-winged or all j-shaped. Burr removal also enhances the appearance of the finished IC device by providing smooth and straight lines along the exposed sides of the leads.

As described above, in dual row QFP packages, every other lead is bent down and in to form a j-shape lead while intervening leads are bent down and out into gull-wing shapes and, consequently, edges of adjacent leads that were in close proximity after the cutting of the dam bar become separated after forming. The risk of an electrical short between adjacent burrs is, as a result of the forming, greatly reduced. In some implementations of the invention, the burrs are not trimmed and are left in place. This would leave each lead with a pair of perpendicular burrs corresponding to a dam bar that has been cut. Eliminating the burr-trimming step may increase manufacturing speed and reduce manufacturing time and/or cost.

The sides of case 201 in FIG. 2 are crenellated with recesses or crenels such as exemplary recess 202 and tabs or merlons such as exemplary tabs 203 and 204. The tabs and recesses of the outline of the case 201 may be tapered (not shown in FIG. 2) to allow easier access to the leads for trimming and forming. In addition, the bottom of the case 201 may have perpendicular channels along the sides such as exemplary channel 205 shown as hidden details. These channels provide room for the inner leads, which will be formed into j-shaped leads, as described elsewhere herein.

FIG. 3 shows a plan view of the IC device 200 of FIG. 2 after trimming and forming. As can be seen, the tabs and recesses of the outline of the case 201 are beveled down from the top surface of the case 201 down to the plane of the tops of the leads, such as the below-described exemplary leads. In other words, the tabs and recesses are shown as tapered. The burrs from the dam bars have been trimmed off. The outer leads, such as the outer lead 102, have been formed into gull-wing-shaped leads. The inner leads, such as inner lead 103, have been formed into j-shaped leads. FIG. 3 includes detail area 300, which is described in further detail below.

Figure 4:
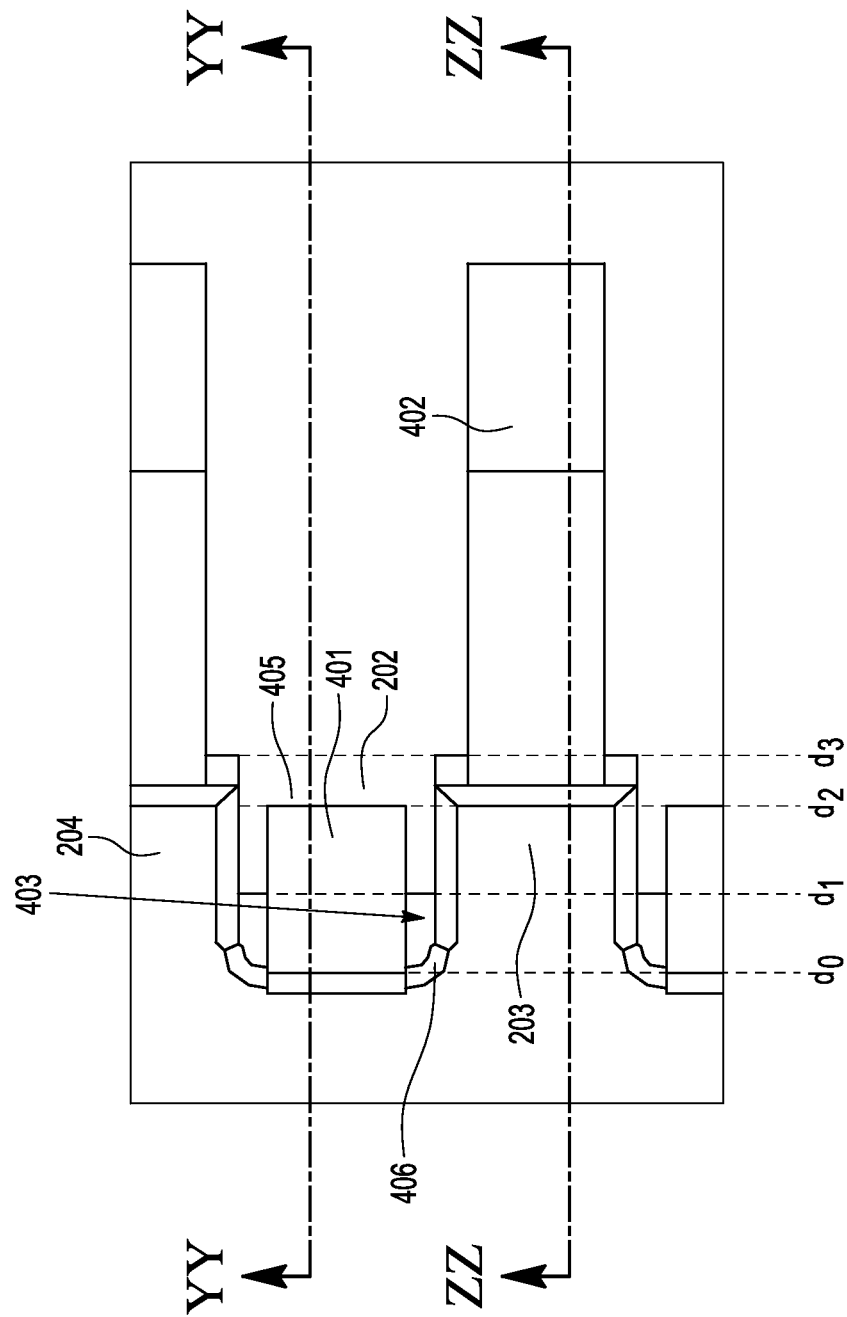
FIG. 4 shows a detail of FIG. 3.

FIG. 4 shows detail 300 of FIG. 3. Detail 300 includes tab 203 and recess 202. As described above, the sides of the tab 203 and the recess 202 are beveled. Detail 300 also includes (1) inner lead 401, which is substantially similar to the above-described exemplary inner lead 103 of FIG. 2 and FIG. 3 and (2) outer lead 402, which is substantially similar to the above-described exemplary outer lead 102 of FIG. 2 and FIG. 3. Inner lead 401 is formed to be a j-shaped lead and is bent into a corresponding channel (not shown) on the bottom of case 201.

In FIG. 4, the portion of inner lead 401 that is visible is the exposed top portion, which goes from the back of recess 202 to top elbow 405 (sometimes also referred to as a knee or a shoulder) of inner lead 401, shown as the section of inner lead 401 between dashed line $d_0$ and dashed line $d_2$, where line $d_0$ represents the back edge of recess 202 and line $d_2$ represent the location of the top elbow of inner lead 401. The segment of the exposed portion of a lead that extends from the case edge to the first bend, if any, in the lead, is referred to herein as the exposed flat segment.

Figure 5:
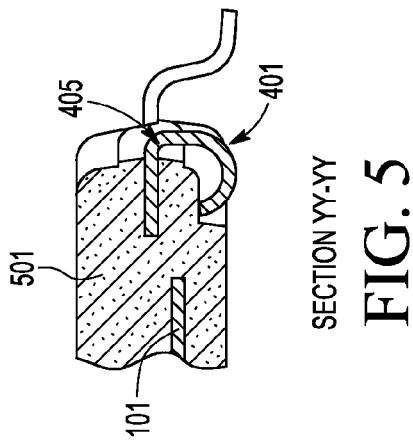
FIG. 5 shows a cross-sectional view of a segment of the IC device of FIG. 2 corresponding to the detail of FIG. 4 along a first cut line.

FIG. 5 shows a cross-sectional view of the segment of IC device 200 corresponding to detail 300, along cut-line YY-YY, of FIG. 4. FIG. 5 shows a cross-section of inner lead 401, including the encapsulated segment, the exposed flat segment, the vertical segment, and the bent-back segment that is in the corresponding channel at the bottom of case 201. Note that FIG. 5 shows the inner and outer leads having their encapsulated and exposed flat segments at the same horizontal level. FIG. 5 also shows a cross-section of a portion of die pad 101 of FIG. 1 and of molding compound 501 of case 201. Note that FIG. 5 shows an alternative taper down from the top of case 201 to the top of inner lead 401 that is a non-linear varying curve rather than a simple linear bevel as described above in reference to FIG. 4.

Figure 6:
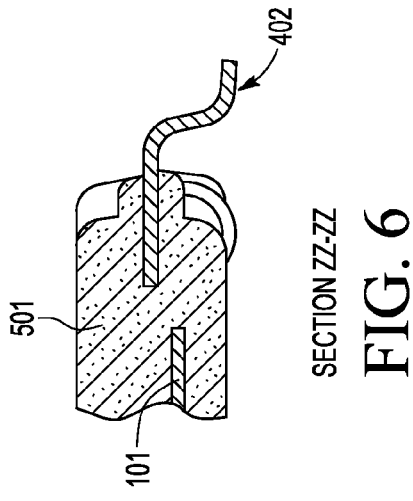
FIG. 6 shows a cross-sectional view of a segment of the IC device of FIG. 2 corresponding to the detail of FIG. 4 along a second cut line.

FIG. 6 shows a cross-sectional view of the segment of IC device 200 corresponding to detail 300, along cut-line ZZ-ZZ, of FIG. 4. FIG. 6 shows a cross section of outer lead 402, including the encapsulated segment and the visible gull-wing-shaped external segment, including the exposed flat segment ranging from the case edge to the first bend. Note that FIG. 6 shows the inner and outer leads having their encapsulated and exposed flat segments at the same horizontal level. FIG. 6 also shows a cross-section of a portion of die pad 101 of FIG. 1 and of the molding compound of case 201. Note that FIG. 6 shows the taper down from the top of case 201 to the top of outer lead 402 as a non-linear varying curve rather than the simple linear bevel described above in reference to FIG. 4.

FIG. 4 further shows lead webbing 403, which fills part of the space between a first edge of the exposed flat segment of inner lead 401 and a first side 406 of recess 202, which contains inner lead 401. In other words, the proximal part of the lead gap between inner lead 401 and adjacent outer lead 402 is filled with lead webbing 403 and part of tab 203. The thickness of lead webbing 403 is approximately the same as the width of lead frame 101 of FIG. 1. Accordingly, the thickness of the lead webbing 403 is approximately the same as the thickness of the inner lead 401 and is typically within 20% of the thickness of the inner lead 401. Note, however, that the thickness of the lead webbing 403 may vary from the edge of the recess 202 and the edge of the inner lead 401. Typically, the thickness of the lead webbing 403 is no more than twice the thickness of the inner lead 401. In other words, the thickness of any part of the lead webbing 403 is typically within 100% of the thickness of the inner lead 401.

Note that the first side 406 of the recess 202 corresponds to a first side 406 of the tab 203 and a second side of the recess 202 corresponds to a first side of the tab 204. The lead webbing 403 prevents small conductive objects from getting lodged between the inner lead 401 and the tab 203 and/or the adjacent outer lead 402. Small conductive objects such as, for example, shavings or clippings may be generated and introduced during forming and trimming. Small conductive objects may also appear elsewhere in the environment of the IC device 200.

The lead webbing 403 comprises the same molding compound as the case 201. The distance from the edge of the inner lead 401 to the nearest side of recess 202 is 1 mm+/−0.5 mm. The mold cavity for making the case 201 includes a void for lead webbing 403, and lead webbing between the other inner-lead exposed flat segments and the corresponding recess sides. After the completion of the encapsulant-curing step, a preliminary lead webbing extends out to the proximal, or inner, edge of the dam bar, represented by dashed line $d_3$ in FIG. 4.

During trimming and forming, when the inner lead 401 is bent at the top elbow, the distal (or outer) portions of the preliminary lead webbing break off leaving behind the lead webbing 403. After trimming and forming, the lead webbing 403 extends to a distance between lines $d_0$ and $d_2$, represented by dashed line $d_1$. Note that individual lead webbings of the IC device 200 might break off at different points and do not necessarily all extend the same distance out. Note that the lead webbings 403 may be trimmed so that all lead webbings in the IC device 200 extend substantially the same distance out from the case. For example, the lead webbings 403 may be trimmed so that the variation of the distance of the distal edge of the lead webbing from line $d_0$ for any lead webbing of the IC device 200 is less than 10% from the average distance.

Figure 7:
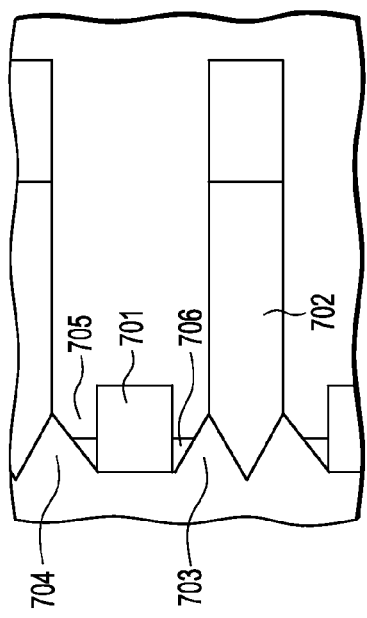
FIG. 7 shows a plan view of a detail of a case edge of an IC device in accordance with another embodiment of the invention.

FIG. 7 shows a plan view of detail 700 of a case edge of an IC device in accordance with another embodiment of the invention, where the tabs (or crenels) are saw-tooth shaped. Detail 700 corresponds generally to detail 300 of FIG. 4. Detail 700 shows inner lead 701, outer lead 702, tabs 703 and 704, recess 705, and lead webbing 706. As can be seen, exemplary tab 703 is saw-tooth shaped. The edges of the case of the IC device, including the edges of the tab 703, may be tapered (not shown), similarly to the case-outline tapering described above in reference to the IC device 200. Exemplary lead webbing 706 is substantially triangular in shape to match the contours of the recess 705 formed by the edges of the tabs 703 and 704. Note that the width of the lead webbing 706 varies depending on the width of the gap between the inner lead 701 and the tab 703, which varies with the distance from the back of the recess 705. This width varies from zero to the lead-gap width for the leads 701 and 702. Also note that the distal edge of the lead webbing 706 may be an irregular contour due to the above-described breakage during the bending of the top elbow of the inner lead 701.

Embodiments of the invention have been described where the edges of the recesses are linear segments in a plan view, where the recess edges may run parallel to, or be at an angle to, the edges of the corresponding inner lead. In alternative embodiments, the edges of the recess are non-linear curves. In these embodiments, a lead webbing similarly extends from an edge of a lead to the near edge of the recess and from the back of the recess to a distal edge of the webbing that is not further than the top elbow of the corresponding lead. In other words, the lead webbing may extend as far as the exposed flat segment of the corresponding lead extends.

An embodiment of the invention has been described where lead webbing 403 of FIG. 4 comprises the same molding compound as the case 201. In alternative embodiments, the lead webbing comprises a material different from the molding compound of the corresponding case.

An embodiment of the invention has been described where lead webbing is used in a dual row QFP package. In alternative embodiments, lead webbing is used in plastic dual inline package (PDIP), small-outline integrated circuit (SOIC), flat pack (FP), QFP, high-density QFP, PLCC, or other types of IC device packages, with appropriate modifications, as would be appreciated by a person of ordinary skill in the art.

An embodiment of the invention has been described where the exposed portions of the leads have one or more bends in them to form j-shaped or gull-wing-shaped leads. In some alternative embodiments of the invention, the exposed portions have no bends in them and extend straight out from the case to form flat leads. In these embodiments, the lead webbings may extend out to any arbitrary distance from the case edge to the ends of the exposed portions of the leads.

An embodiment of the invention has been described where the case edges are crenellated with recesses and tabs. In some alternative embodiments, the case edges, not including the lead webbing, are substantially straight and not crenellated. The lead webbing in these embodiments (1) extends between adjacent leads and (2) extend out to a location between the nominal case edge and the proximal side of the dam bar, as determined by the bending points of the leads and/or any trimming that may be performed.

An embodiment of the invention has been described where inner and outer leads alternate on all sides of an IC device. In some alternative embodiments of the embodiment, lead webbings are placed along some, but not all, sides of an IC device. In some alternative embodiments, some pairs of adjacent leads may both be inner leads or both be outer leads with lead webbing between them.

Embodiments of the invention have been described having particular dimensions defined. In alternative embodiments, the dimensions may vary beyond the described dimension ranges.

It will be further understood that various changes in the details, materials, and arrangements of the parts which have been described and illustrated in order to explain the nature of this invention may be made by those skilled in the art without departing from the scope of the invention as expressed in the following claims.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

Unless explicitly stated otherwise, each numerical value and range should be interpreted as being approximate as if the word "about" or "approximately" preceded the value of the value or range. As used in this application, unless otherwise explicitly indicated, the term "connected" is intended to cover both direct and indirect connections between elements.

For purposes of this description, the terms "couple," "coupling," "coupled," "connect," "connecting," or "connected" refer to any manner known in the art or later developed in which energy is allowed to be transferred between two or more elements, and the interposition of one or more additional elements is contemplated, although not required. The terms "directly coupled," "directly connected," etc., imply that the connected elements are either contiguous or connected via a conductor for the transferred energy.

The use of figure numbers and/or figure reference labels in the claims is intended to identify one or more possible embodiments of the claimed subject matter in order to facilitate the interpretation of the claims. Such use is not to be construed as limiting the scope of those claims to the embodiments shown in the corresponding figures.

The embodiments covered by the claims in this application are limited to embodiments that (1) are enabled by this specification and (2) correspond to statutory subject matter. Nonenabled embodiments and embodiments that correspond to non-statutory subject matter are explicitly disclaimed even if they fall within the scope of the claims.

Although the steps in the following method claims are recited in a particular sequence with corresponding labeling, unless the claim recitations otherwise imply a particular sequence for implementing some or all of those steps, those steps are not necessarily intended to be limited to being implemented in that particular sequence.

The invention claimed is:

1. A packaged integrated circuit (IC) device, comprising:
a lead frame having a plurality of leads, including first and second leads;
a case encapsulating a first portion of the lead frame, wherein:
 each of the first and second leads has (i) an encapsulated portion covered by the case and (ii) an exposed portion that protrudes from the case;
 the exposed portion of each of the first and second leads has an exposed flat segment proximal to the case;
 the first lead is adjacent to the second lead; and
 the exposed flat segment of the first lead is parallel to the exposed flat segment of the second lead; and
a first lead webbing located between the exposed flat segment of the first lead and the exposed flat segment of the second lead,
wherein a thickness of the first lead webbing is within 20% of a thickness of the first lead.

2. The device of claim 1, wherein the device further comprises:
a semiconductor die attached to the lead frame and electrically coupled to the plurality of leads.

3. The device of claim 1, wherein:
the first lead is one of a plurality of inner leads;
the second lead is one of a plurality of outer leads;
each of the inner leads is bent into a j-shaped lead; and
each of the outer leads is bent into a gull-wing-shaped lead.

4. The device of claim 3, wherein each of the inner and outer leads has a pair of exposed perpendicular burrs corresponding to a dam bar that has been cut.

5. The device of claim 3, wherein:
the device has four sides in a plan view;
each side of the device has one fourth of the inner leads; and
each side of the device has one fourth of the outer leads.

6. The device of claim 3, wherein:
the device has sides crenellated with alternating recesses and tabs;
each of the inner leads emerges from the case in a corresponding recess; and
each of the outer leads emerges from the case at a corresponding tab.

7. The device of claim 6, wherein each of the tabs and recesses is tapered.

8. The device of claim 7, wherein the taper is linear.

9. The device of claim 7, wherein the taper is non-linear.

10. The device of claim 6, wherein, for each recess, the device has a corresponding channel in the bottom of the case to provide space for the corresponding inner lead.

11. The device of claim 6, wherein:
the first lead webbing extends from the first lead to a first side of the corresponding recess;
the exposed flat segment of the first lead extends to a top elbow of the first lead; and
the first lead webbing extends from the back of the corresponding recess to a point not beyond the top elbow of the first lead.

12. The device of claim 6, wherein:
the tabs are saw-tooth shaped; and
the first lead webbing is substantially triangular.

13. A method for packaging an integrated circuit (IC) device comprising a lead frame having a plurality of leads, the plurality of leads including adjacent first and second leads, the method comprising:
(a) attaching a semiconductor die to the lead frame;
(b) electrically connecting the die to the lead frame with bond wires, thereby forming an assembly of the lead frame, die, and bond wires;
(c) encapsulating the assembly, wherein the encapsulating comprises:
 placing the assembly inside a cavity of a mold form;
 injecting uncured molding compound into the cavity, wherein:
  the lead frame comprises a first dam bar perpendicularly attached to the first and second leads;
  the molding compound extends out to the first dam bar to form a preliminary first lead webbing; and
  each of the first and second leads has:
   (i) an encapsulated portion covered by the molding compound; and
   (ii) an exposed portion that protrudes from the molding compound;
 curing the molding compound; and
 removing the encapsulated assembly from the mold form;
(d) cutting the first dam bar between the first and second leads;
(e) trimming the IC device; and
(f) forming the IC device, wherein:
 the exposed portion of the first and second leads has an exposed flat segment proximal to the case;
 the exposed flat segment of the first lead is parallel to the exposed flat segment of the second lead;
 the first lead webbing is formed from the preliminary first lead webbing; and
 the first lead webbing is located between the exposed flat segment of the first lead and the exposed flat segment of the second lead.

14. The method of claim 13, wherein the first lead webbing is reduced in size in at least one of the trimming and forming steps.

15. The method of claim 13, wherein, in the forming step:
the first lead is an inner lead bent into a j-shaped lead; and
the second lead is an outer lead bent into a gull-wing-shaped lead.

16. The method of claim 13, wherein:
after the first dam bar is cut, burrs corresponding to the first dam bar remain on the first and second leads; and
the burrs remain on the first and second leads after the forming step.

17. The method of claim 13, wherein:
after the first dam bar is cut, burrs corresponding to the first dam bar remain on the first and second leads; and
the burrs on the first and second leads are removed in the trimming step.

18. The method of claim 13, wherein, in the forming step:
the first lead is bent down at a top elbow;
distal portions of the preliminary first lead webbing beyond the top elbow of the first lead break off to leave behind the first lead webbing.

* * * * *